United States Patent
Cerioni

(10) Patent No.: US 10,386,217 B2
(45) Date of Patent: Aug. 20, 2019

(54) METHOD FOR OPERATING A NUCLEAR MAGNETIC FLOWMETER AND NUCLEAR MAGNETIC FLOWMETER

(71) Applicant: Krohne AG, Basel (CH)

(72) Inventor: Lucas Matias Ceferino Cerioni, Dordrecht (NL)

(73) Assignee: KROHNE AG, Basel (CH)

( * ) Notice: Subject to any disclaimer, the term of this patent is extended or adjusted under 35 U.S.C. 154(b) by 291 days.

(21) Appl. No.: 15/594,955

(22) Filed: May 15, 2017

(65) Prior Publication Data

US 2017/0328755 A1    Nov. 16, 2017

(30) Foreign Application Priority Data

May 15, 2016 (DE) .................. 10 2016 108 996

(51) Int. Cl.
*G01F 1/716* (2006.01)
*G01R 33/30* (2006.01)

(52) U.S. Cl.
CPC ........... *G01F 1/716* (2013.01); *G01R 33/307* (2013.01)

(58) Field of Classification Search
CPC .............................. G01R 33/307; G01F 1/716
See application file for complete search history.

(56) References Cited

U.S. PATENT DOCUMENTS

| | | | |
|---|---|---|---|
| 5,023,551 A | 6/1991 | Kleinberg et al. | |
| 5,814,991 A * | 9/1998 | Deimling | G01R 33/50 324/309 |
| 6,466,013 B1 * | 10/2002 | Hawkes | G01N 24/081 324/303 |
| 6,833,698 B2 * | 12/2004 | Sun | G01V 3/32 324/303 |
| 6,841,996 B2 | 1/2005 | Madio et al. | |
| 6,941,096 B2 | 10/2005 | Freedman | |
| 7,015,696 B2 * | 3/2006 | Kabasawa | G01R 33/341 324/309 |
| 7,622,919 B2 * | 11/2009 | Song | G01N 24/081 324/307 |
| 7,852,077 B2 * | 12/2010 | Song | G01N 24/081 324/309 |
| 10,168,444 B2 * | 1/2019 | Jachmann | G01V 3/32 |
| 2003/0001569 A1 * | 1/2003 | Chen | G01R 33/50 324/303 |

(Continued)

*Primary Examiner* — Dixomara Vargas
(74) *Attorney, Agent, or Firm* — David S. Safran; Roberts Mlotkowski Safran Cole & Calderon, P.C.

(57) ABSTRACT

A method for operating a nuclear magnetic flowmeter in which the necessary time for determining a longitudinal relaxation time constant of the medium is reduced in comparison to the prior art by at least one nuclear-magnetic measuring process being carried out on a magnetized medium in the measuring tube. The at least one nuclear-magnetic measuring process includes an inversion pulse and acquisition sequences, each acquisition sequence beginning at a starting point in time in respect to the at least one nuclear-magnetic measuring process and has an activating pulse, a first waiting interval, a first refocusing pulse, an echo interval with a duration, a second refocusing pulse, a second waiting interval and a deactivating pulse. An echo signal is measured in the echo interval, and a longitudinal relaxation time constant of the medium is determined using the echo signals.

11 Claims, 2 Drawing Sheets

(56) References Cited

U.S. PATENT DOCUMENTS

| | | | | |
|---|---|---|---|---|
| 2003/0214287 A1* | 11/2003 | Sun | G01R 33/44 | 324/303 |
| 2005/0134266 A1* | 6/2005 | Kabasawa | G01R 33/341 | 324/309 |
| 2005/0248342 A1* | 11/2005 | Rottengatter | G01V 3/32 | 324/303 |
| 2008/0024128 A1* | 1/2008 | Song | G01N 24/081 | 324/307 |
| 2010/0134104 A1* | 6/2010 | Song | G01N 24/081 | 324/309 |
| 2011/0025327 A1* | 2/2011 | Deoni | G01R 33/50 | 324/309 |
| 2014/0292330 A1* | 10/2014 | Gulani | G01R 33/3614 | 324/309 |
| 2016/0018555 A1* | 1/2016 | Jachmann | G01V 3/32 | 324/303 |

* cited by examiner

METHOD FOR OPERATING A NUCLEAR MAGNETIC FLOWMETER AND NUCLEAR MAGNETIC FLOWMETER

BACKGROUND OF THE INVENTION

Field of the Invention

The invention relates, on the one hand, to a method for operating a nuclear magnetic flowmeter. The nuclear magnetic flowmeter thereby has a measuring tube for carrying out the method, wherein a medium is present in the measuring tube and the medium is magnetized in the measuring tube.

The invention, on the other hand, relates to a nuclear magnetic flowmeter. The nuclear magnetic flowmeter has a measuring tube, a magnetization means and a measuring unit. During operation of the nuclear magnetic flowmeter, a medium is present in the measuring tube and the magnetization means magnetizes the medium in the measuring tube.

Description of Related Art

A nuclear magnetic flowmeter uses nuclear magnetic measuring procedures for analysis and, in particular, for flow measurement of a medium present in a measuring tube that is either stagnant in the measuring tube or flows through the measuring tube. Nuclear magnetic measuring procedures influence the precession of of atomic nuclei of a medium in the presence of a macroscopic magnetic field, which has previously magnetized the medium, by exciting the atomic nuclei to nuclear magnetic resonances and they evaluate the nuclear magnetic resonances. A nuclear magnetic flowmeter, thus, has a magnetization means for generating a magnetic field in a medium present in the measuring tube and has a measuring unit for exciting the medium in the measuring tube and for measuring the effect of the excitation on the medium in the measuring tube. Thereby, the measuring unit is designed to carry out methods for operating a nuclear magnetic flowmeter.

The atomic nuclei of the elements that exhibit nuclear spin also exhibit a magnetic moment caused by the nuclear spin. The nuclear spin can be considered an angular momentum that can be described by a vector and, accordingly, the magnetic moment can also be described by a vector that is parallel to the vector of the angular momentum. The presence of a macroscopic magnetic field creates a surplus of atomic nuclei having magnetic moments in a medium, which are aligned parallel to the macroscopic magnetic field, whereby the medium has a macroscopic magnetization that can be described by a vector. A macroscopic magnetization of a medium parallel to the macroscopic magnetic field is also called a longitudinal magnetization. The temporal course of the macroscopic magnetization in a macroscopic magnetic field is called a longitudinal relaxation and is characterized by a longitudinal relaxation time constant $T_1$. The longitudinal relaxation is also called spin lattice relaxation and the longitudinal relaxation time constant is called spin lattice relaxation time constant.

In the presence of a macroscopic magnetic field such as the magnetic field generated by the magnetization means, the vector of the magnetic moment of an atomic nucleus precesses around the vector of the macroscopic magnetic field at the point of the atomic nucleus. The frequency of precession is called the Larmor frequency $\omega_L$ and is proportional to the absolute value of the magnetic strength B of the magnetic field. The Larmor frequency is calculated using $\omega_L = \gamma$ B. There, $\gamma$ is the gyromagnetic ratio, which is at a maximum for hydrogen nuclei.

Influencing the atomic nuclei with a magnetic moment in a magnetized medium basically takes place by sending electromagnetic pulses into the medium, wherein the electromagnetic pulses exhibit the Larmor frequency. An excitation of atomic nuclei with a magnetic moment in a magnetized medium to nuclear magnetic resonances is carried out using suitable electromagnetic pulses, which are called activating pulses. The excitation creates a nuclear magnetic resonance in the form of a transversal macroscopic magnetization of the medium, which rotates at the Larmor frequency. The rotating, transversal, macroscopic magnetization can be measured as a free induction decay, which is abbreviated to FID, or as an echo signal after a refocusing. A refocusing of the rotating, transversal magnetization is necessary when the relation of the phases to one another of the individual magnetic moments of the atomic nuclei present after excitation is disturbed, for example due to inhomogeneities in the macroscopic magnetic field. A refocusing is carried out using suitable electromagnetic pulses, which are called refocusing pulses. A suitable electromagnetic pulse that moves the transversal, rotating magnetization of the medium back to being parallel to the macroscopic magnetic field is called a deactivating pulse. Furthermore, inversion pulses are also used. These are suitable electromagnetic pulses that invert the magnetization of the medium parallel to the macroscopic magnetic field so that the magnetization of the medium is antiparallel to the macroscopic magnetic field.

In the following, without limiting the universal applicability, a right-handed Cartesian coordinate system is assumed with an x-axis, a y-axis and a z-axis and a mathematically positive direction of rotation, wherein the positive z-direction is aligned parallel to a vector of the macroscopic magnetic field. Thus, the macroscopic magnetization of a medium using the macroscopic magnetic field is also aligned parallel to the z-axis. An activating pulse then causes rotation of the vector of the macroscopic magnetization of the medium around an axis of the coordinate system, so that a rotating, transversal magnetization is present, which rotates in the xy-plane. Similarly, a deactivating pulse causes a rotation of the vector of the macroscopic magnetization of the medium around an axis of the coordinate system, so that only a longitudinal magnetization is present again. Accordingly, an inversion pulse causes a rotation of the vector of the macroscopic magnetization of the medium around an axis of the coordinate system so that the longitudinal magnetization is no longer parallel to the z-axis, rather is aligned antiparallel.

A medium present in the measuring tube can also have several phases. For analysis of the individual phases, atomic nuclei of the individual phases have to be able to be excited to differentiable nuclear magnetic resonances. For example, nuclear magnetic resonances can be differentiated from one another when the longitudinal relaxations of the individual phases have longitudinal relaxation time constants $T_1$ that differ from one another. Since the multi-phase medium extracted from oil sources essentially has the fluid phases crude oil and (salt)water and the gaseous phase natural gas, the atomic nuclei of all phases have hydrogen nuclei and since, normally, in particular, the phases crude oil and (salt)water are characterized by differing longitudinal relaxation time constants $T_1$, nuclear magnetic flowmeters are particularly suitable for the analysis and, in particular, for flow measurement of media extracted from oil sources.

Thus, the knowledge of a longitudinal relaxation time constant $T_1$ of a medium is generally a requirement for further analysis, and in particular, for flow measurement of a medium through the measuring tube of a nuclear magnetic flowmeter. Since further analysis and flow measurement of the medium during the determination of the longitudinal relaxation time constant $T_1$ of the medium are often impaired, different methods for operating a nuclear magnetic flowmeter and nuclear magnetic flowmeters are known from the prior art that strive to achieve a reduced time effort for the determination of a longitudinal relaxation time constant $T_1$.

SUMMARY OF THE INVENTION

One object of the present invention is, thus, to provide a method for operating a nuclear magnetic flowmeter as well as a nuclear magnetic flowmeter, in which the necessary time for determining a longitudinal relaxation time constant $T_1$ of a medium is reduced in comparison to the prior art.

According to a first teaching, the invention relates to a method for operating a nuclear magnetic flowmeter in which the above derived and described object is achieved. The method according to the invention is essentially characterized by the following method steps.

In one method step, at least one nuclear-magnetic measuring process is carried out on the magnetized medium in the measuring tube. The at least one nuclear-magnetic measuring process includes an inversion pulse and N={2, 3, 4, ... } acquisition sequences. Each of the N acquisition sequences begins at a starting point in time $t_{s,n}$ with n= {1, ..., N} in respect to the at least one nuclear-magnetic measuring process and has an activating pulse, a first waiting interval with a duration $\Delta t_d$, a first refocusing pulse, an echo interval with a duration $\Delta t_e$, a second refocusing pulse, a second waiting interval with the duration $\Delta t_d$ and a deactivating pulse. Thereby, in order of time after the starting point in time $\Delta t_{s,n}$, the activating pulse for exciting a nuclear magnetic resonance, the first waiting interval, the first refocusing pulse, the echo interval, the second refocusing pulse, the second waiting interval and the deactivating pulse follow. Furthermore, an echo signal $s_{e,n}$ of an echo of the nuclear magnetic resonance is measured in the echo interval, wherein preferably an intensity of the echo is measured as echo signal.

In a further method step, a longitudinal relaxation time constant $T_1$ of the medium is determined using the echo signals $s_{e,1}, \ldots, s_{e,N}$.

The inversion pulse, the activating pulse, the first and the second refocusing pulse and the deactivating pulse each have either one suitable electromagnetic pulse or several suitable electromagnetic pulses. Suitable electromagnetic pulses include, for example, adiabatic and compound pulses and soft and hard pulses as well as any combination of the described pulses. The first and the second refocusing pulses are identical with the exception of their occurrence in time. The first and the second waiting interval are also identical with the exception of their occurrence in time. The waiting intervals are used, in particular, for the decaying of interferences.

One advantage of the method according to the invention as compared to the method known from the prior art is that the time required to carry out the method is reduced.

In order to further reduce the time required for performance of the method, it is provided in a first implementation of the method according to the invention that the duration $\Delta t_d$ is determined according to $$\Delta t_d = t_{ref} - \frac{2\Delta t_{90}}{\pi}$$

and/or the duration $\Delta t_e$ is determined according to $$\Delta t_e = 2 t_{ref}$$

wherein $\Delta t_{ref}$ is a reference duration and $\Delta t_{90}$ is a duration of the activating pulse.

It is provided in a further development of the above implementation that the reference duration $\Delta t_{ref}$ is determined using the duration of a decaying of interferences. Thereby, the interferences are caused by the activating pulse and/or the first refocusing pulse. It is provided, for example, in one implementation that the reference duration $\Delta t_{ref}$ is measured until interferences have fallen to a measure tolerable for the measurement of the echo signal.

The longitudinal relaxation follows an exponential time course, which is why the dynamics of the longitudinal relaxation decrease over time. In order to better understand the dynamics, it is thus provided in a further implementation that a time span between each of two successive starting points in time $t_{s,n}$ and $t_{s,n+1}$ is determined such that the time span increases. Preferably, the time span increases exponentially.

When at least two nuclear magnetic measuring processes are carried out on the medium magnetized in the measuring tube, it is advantageous when interferences can decay between the two nuclear magnetic measuring processes. Thus, it is provided in a further implementation of the method that after the N acquisition steps, a repeat interval with a duration $\Delta t_w$ is waited for. Thereby, the duration $\Delta t_w$ is at least as long as the largest span between two successive starting points in time $t_{s,n}$ and $t_{s,n+1}$ or at least as long as the span from the first starting point in time $t_{s,1}$ in respect to one end of the inversion pulse.

In order to improve the quality of the echo signals, it is provided in a further implementation that at least two nuclear-magnetic measuring processes are carried out such that, in each case, two chronologically successive echo signals $s_n$ and $s_{n+1}$ in the echo intervals are measured in different nuclear-magnetic measuring processes. Since two each of the successive echo signals $s_n$ and $s_{n+1}$ belong to different and successive measuring processes, the time span of the measurements of the echo signals $s_n$ and $s_{n+1}$ is increased, which improves the quality of the measurement.

The implementation is described in the following in general using an example. In this example, the the longitudinal relaxation time constant $T_1$ of the medium is determined using the echo signals $s_{e,1}, \ldots, s_{e,9}$. Thus, overall N=9 acquisition sequences are carried out, wherein the N=9 acquisition sequences are evenly distributed in a first, a second and a third nuclear magnetic measuring process.

In the first nuclear magnetic measuring process, the echo signal $s_{e,1}$ is measured after the starting point in time $t_{s,1}$, the echo signal $s_{e,4}$ after the starting point in time $t_{s,4}$, and the echo signal $s_{e,7}$ after the starting point in time $t_{s,7}$.

In the second nuclear magnetic measuring process, following the first nuclear magnetic measuring process in terms of time, the echo signal $s_{e,2}$ is measured after the starting point in time $t_{s,2}$, the echo signal $s_{e,5}$ after the starting point in time $t_{s,5}$, and the echo signal $s_{e,8}$ after the starting point in time $t_{s,8}$.

In the third nuclear magnetic measuring process, following the second nuclear magnetic measuring process in terms of time, the echo signal $s_{e,3}$ is measured after the starting point in time $t_{s,3}$, the echo signal $s_{e,6}$ after the starting point in time $t_{s,6}$, and the echo signal $s_{e,9}$ after the starting point in time $t_{s,9}$.

Thereby, the starting points in time $t_{s,n}$ are strictly monotonously increasing, so that $t_{s,9} > t_{s,8} > t_{s,7} > t_{s,6} > t_{s,5} > t_{s,4} > t_{s,3} > t_{s,2} > t_{s,1}$. Thus, the time distance in this implementation between two successive echo signals $s_n$ and $s_{n+1}$ is greater than when these are only measured during a single nuclear magnetic measuring process.

It is provided in a further implementation that a $+180°_x$-pulse is used as the inversion pulse, a $+90°_x$-pulse is used as the activating pulse, a $-90°_x$-pulse is used as the deactivating pulse and a $+180°_y$-pulse is used for both the first refocusing pulse the second refocusing pulse.

A $+180°_x$-pulse is an electromagnetic pulse that is designed for rotation of the vector of the macroscopic magnetization to 180° in the positive rotation direction around the x-axis of the Cartesian coordinate system. A $+90°_x$-pulse is an electromagnetic pulse that is designed for rotation of the vector of the macroscopic magnetization to 90° in the positive rotation direction around the x-axis, and similarly, a $-90°_x$-pulse is an electromagnetic pulse that is designed for rotation of the vector of the macroscopic magnetization to 90° in the negative rotation direction around the x-axis. In contrast to the above rotations, a $+180°_y$-pulse is designed for rotation of the vector of the macroscopic magnetization to 180° in the positive direction of rotation around the y-axis.

In a further implementation, in order to improve the quality of the measured echo signals, it is provided that phase differences between the inversion pulse, the activating pulse, the first refocusing pulse, the second refocusing pulse, the deactivating pulse and the echo signal are cycled. This is also called phase cycling.

In a further development of the above implementation, it is provided that a first nuclear-magnetic measuring process and a second nuclear-magnetic measuring process are carried out in respect to a phase of the inversion pulse and of the activating pulse in the first nuclear-magnetic measuring process in such a manner that the following is valid:

In the first nuclear-magnetic measuring process, a phase difference of the first refocusing pulse and of the second refocusing pulse is 90° each, a phase difference of the deactivating pulse is 180° and a phase difference of the echo signal $s_{e,1}$ is 0°. The phase differences of the inversion pulse and the activating pulse is 0° each, since these are used as a reference.

In the second nuclear-magnetic measuring step, a phase difference of the inversion pulse and of the activating pulse is 180° each, a phase difference of the first refocusing pulse and of the second refocusing pulse is 90° each, a phase difference of the deactivating pulse is 0° and a phase difference of the echo signal is 180°.

In a further development alternative to the above further development, it is provided that a first, a second, a third and a fourth nuclear-magnetic measuring process are carried out in respect to a phase of the inversion pulse and of the activating pulse in the first nuclear-magnetic measuring process in such a manner that the following is valid:

In the first nuclear-magnetic measuring process, a phase difference of the first refocusing pulse and of the second refocusing pulse is 90° each and a phase difference of the deactivating pulse is 180° and a positive real part of the echo signal is measured with a first channel and a positive imaginary part of the echo signal is measured with a second channel. The phase differences of the inversion pulse and the activating pulse are each 0°, since these are used as reference. The first and the second channel are, for example, a part of a measuring unit that is designed for carrying out the method.

In the second nuclear-magnetic measuring process, a phase difference of the inversion pulse and of the activating pulse is 180° each, a phase difference of the first refocusing pulse and of the second refocusing pulse is 90° each and a phase difference of the deactivating pulse is 0° and a negative real part of the echo signal is measured with the first channel and a negative imaginary part of the echo signal is measured with the second channel.

In the third nuclear-magnetic measuring process, a phase difference of the inversion pulse and of the activating pulse is 90° each, a phase difference of the first refocusing pulse and of the second refocusing pulse is 180° each and a phase difference of the deactivating pulse is 270° and that a negative real part of the echo signal is measured with the second channel and a positive imaginary part of the echo signal is measured with the first channel.

In the fourth nuclear-magnetic measuring process, a phase difference of the inversion pulse and of the activating pulse is 270° each, a phase difference of the first refocusing pulse and of the second refocusing pulse is 180° each and a phase difference of the deactivating pulse is 90° and that a positive real part of the echo signal is measured with the second channel and a negative imaginary part of the echo signal is measured with the first channel.

According to a second teaching, the invention relates to a nuclear magnetic flowmeter, in which the derived and described object is achieved. The nuclear magnetic flowmeter according to the invention is initially and essentially wherein the measuring unit is designed, during operation, to carry out at least one nuclear-magnetic measuring process on the magnetized medium in the measuring tube. Thereby, the at least one nuclear-magnetic measuring process includes an inversion pulse and $N=\{2, 3, 4, \ldots\}$ acquisition sequences. Each of the N acquisition sequences begins at a starting point in time $t_{s,n}$ with $n=\{1, \ldots, N\}$ in respect to the at least one nuclear-magnetic measuring process and has an activating pulse, a first waiting interval with a duration $\Delta t_d$, a first refocusing pulse, an echo interval with a duration $\Delta t_e$, a second refocusing pulse, a second waiting interval with the duration $\Delta t_d$ and a deactivating pulse. Furthermore, the measuring unit is designed, during operation, to measure an echo signal $s_{e,n}$ in the echo interval, and to determine a longitudinal relaxation time constant $T_1$ of the medium using the echo signal $s_{e,1}, \ldots, s_{e,N}$.

In a preferred design of the nuclear magnetic flowmeter according to the invention, it is provided that the measuring unit is additionally designed to carry out one of the described methods.

The explanations in respect to the method for operating a nuclear magnetic flowmeter also hold true for the nuclear magnetic flowmeter and vice versa. Even if the method is described in conjunction with a nuclear magnetic flowmeter, the method is not limited to such, rather is also suitable for operating other nuclear magnetic devices. The explanations in respect to the nuclear magnetic flowmeter are also not limited to such, rather are applicable for other nuclear magnetic devices.

In detail, there is a plurality of possibilities to design and further develop the method according to the invention and the nuclear magnetic flowmeter according to the invention. Reference is made to the following description of a preferred embodiment in conjunction with the accompanying drawings.

BRIEF DESCRIPTION OF THE DRAIWNGS

DETAILED DESCRIPTION OF THE INVENTION

Figure 1:
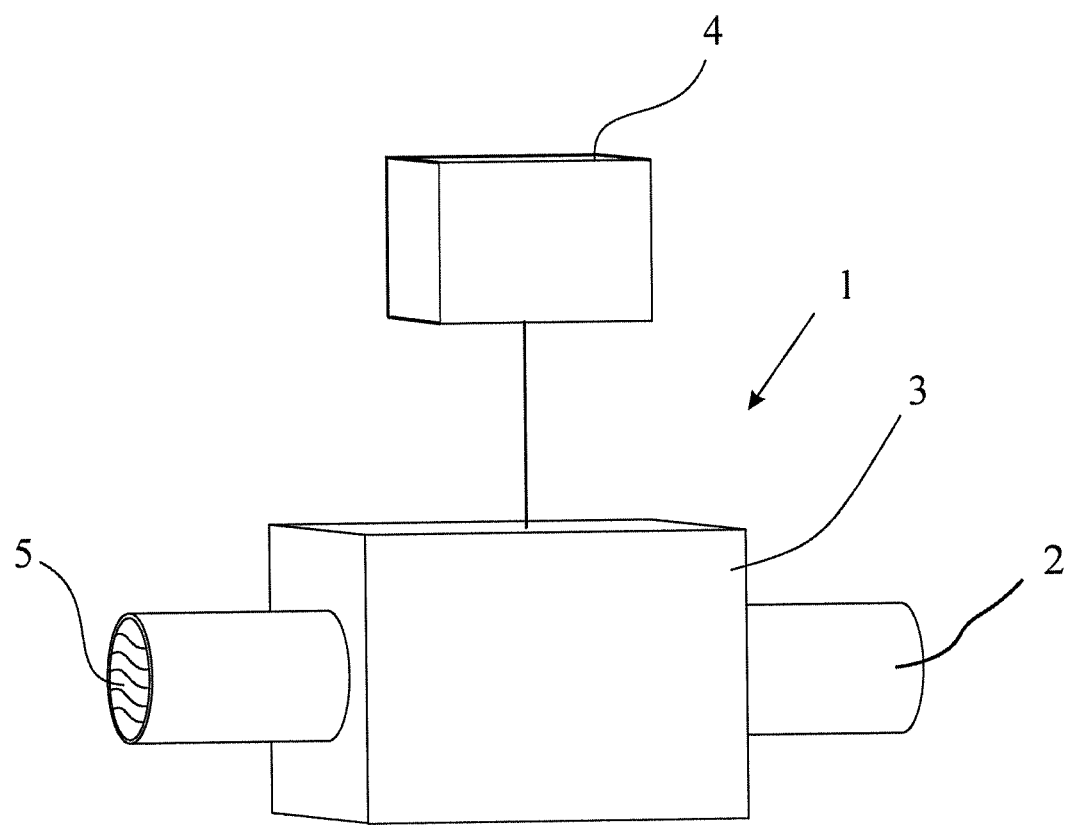
FIG. 1 shows an embodiment of a nuclear magnetic flowmeter.

FIG. 1 shows the nuclear magnetic flowmeter 1 in an abstract, perspective view. The nuclear magnetic flowmeter 1 has the measuring tube 2, the magnetization unit 3 and the measuring unit 4. Since the nuclear magnetic flowmeter 1 is in operation, the medium 5 is present in the measuring tube 2 and the magnetization unit 3 magnetizes the medium 5 present in the measuring tube 2.

The measuring unit 4 carries out the following method for operating the nuclear magnetic flowmeter 1. The method runs continuously during operation, which is why successive nuclear magnetic measuring processes are carried out continuously in terms of time on the medium 5 present in the measuring tube 2. After termination of the method, the measuring unit 4, for example, carries out a method for flow measurement of the medium 5 through the measuring tube 2.

Figure 2:
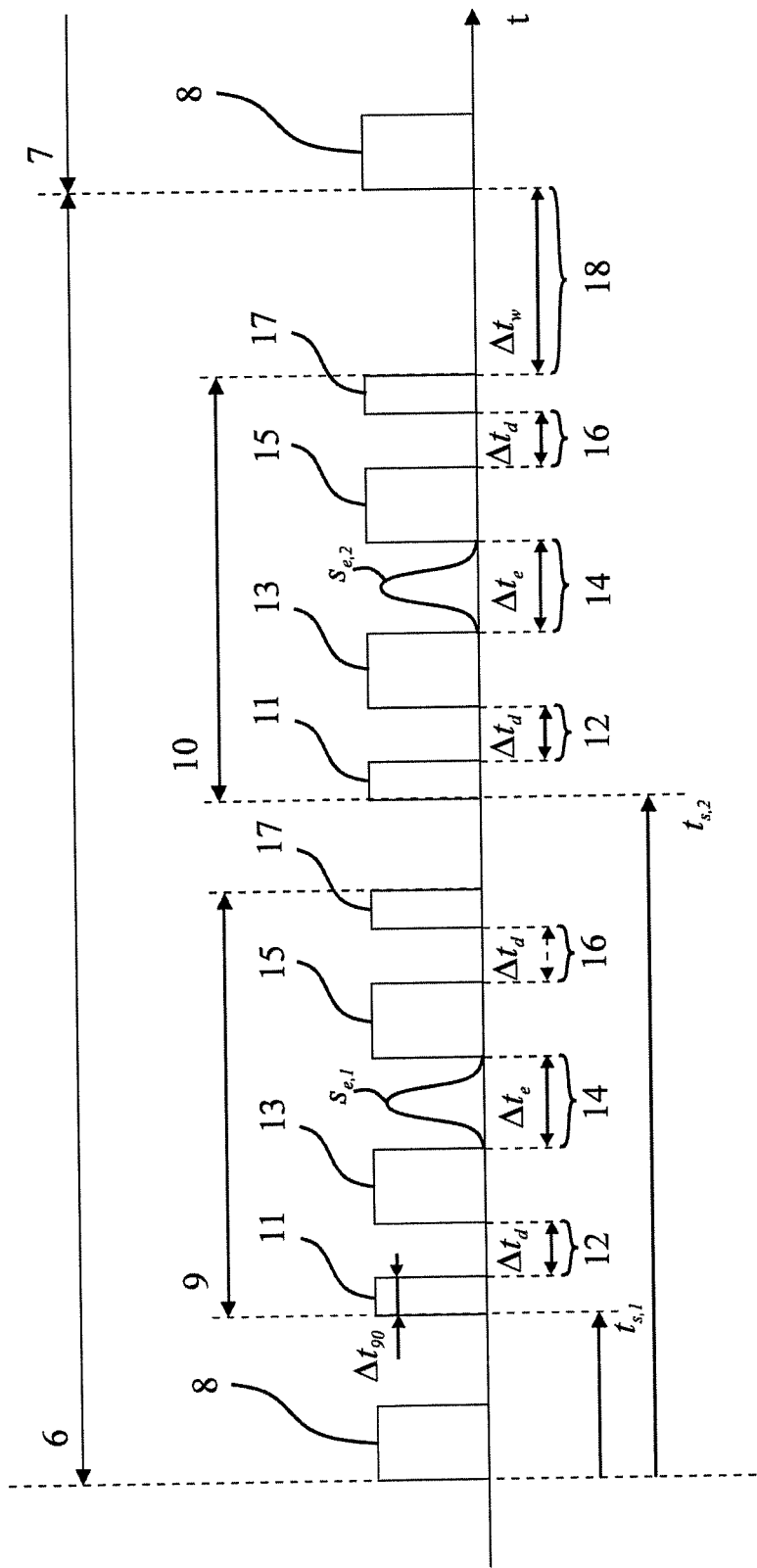
FIG. 2 is a schematic diagram over time, not shown to scale, of a method for operating the nuclear magnetic flowmeter.

In FIG. 2, the first measuring process 6 and a part of the second measuring process 7 are shown schematically and not to scale. Each of the measuring processes 6, 7 has the inversion pulse 8 and N=2 acquisition sequences, i.e., the first acquisition sequence 9 and the second acquisition sequence 10. Normally, the number of acquisition sequences is significantly larger. However, in order to explain the method, it is not necessary to use a large number of acquisition sequences. The first acquisition sequence 9 begins at the starting point in time $t_{s,1}$ (n=1) and the second acquisition sequence 10 at starting point in time $t_{s,2}$ (n=N=2). The starting points in time $t_{s,1}$ and $t_{s,2}$ are thereby each related to the beginning of the first measuring process 6. The beginning of measuring process 6 coincides in time with the beginning of the inversion pulse 8. Each of the acquisition sequences 9, 10 respectively has the activating pulse 11 with the duration $\Delta t_{90}$, the first waiting interval 12 with the duration $\Delta t_d$, the first refocusing pulse 13, the echo interval 14 with the duration $\Delta t_e$, the second refocusing pulse 15, the second waiting interval 16 with the duration $\Delta t_d$ and the deactivating pulse 17.

The echo signal $s_{e,1}$ is measured in the echo interval 14 of the first acquisition sequence 9 and the second echo signal $s_{e,2}$ is measured in the echo interval 14 of the second acquisition sequence 10. A longitudinal relaxation time constant $T_1$ of the medium 5 is determined using the echo signals $s_{e,1}$ and $s_{e,2}$.

After the N=2 acquisition sequences, the repeat interval 18 with the duration $\Delta t_w$ is waited for before the second measuring process 7 begins with the inversion pulse 8.

What is claimed is:

1. Method for operating a nuclear magnetic flowmeter, wherein the nuclear-magnetic flowmeter has a measuring tube, a medium in the measuring tube, the method comprising:

carrying out at least one nuclear-magnetic measuring process on the medium in the measuring tube during which the medium is magnetized, performing at least one nuclear-magnetic measuring process that includes an inversion pulse and N={2, 3, 4, . . . } acquisition sequences, beginning each of the N acquisition sequences at a starting point in time $t_{s,n}$ in which n={1, . . . , N}, each of the acquisition sequences comprising an activating pulse, a first waiting interval with a duration $\Delta t_d$, a first refocusing pulse, an echo interval with a duration $\Delta t_e$, a second refocusing pulse, a second waiting interval with the duration $\Delta t_d$ and a deactivating pulse, measuring an echo signal $s_{e,n}$ during each echo interval, and determining a longitudinal relaxation time constant $T_1$ of the magnetized medium using the echo signal of each the N acquisition sequences.

2. Method according to claim 1, further comprising determining the duration $\Delta t_d$ is determined according to the relationship $$\Delta t_d = t_{ref} - \frac{2\Delta t_{90}}{\pi}$$

and/or the duration $\Delta t_e$ is determined according to the relationship $$\Delta t_e = 2 t_{ref}$$

wherein $\Delta t_{ref}$ is a reference duration and $\Delta t_{90}$ is a duration of the activating pulse.

3. Method according to claim 2, wherein the reference duration $\Delta t_{ref}$ is determined using a duration of decaying of interferences, wherein the interferences are caused by at least one of the activating pulse and the refocusing pulse.

4. Method according to claim 1, wherein a time span between each of two successive starting points in time $t_{s,n}$ and $t_{s,n+1}$ is determined such that the time span increases.

5. Method according to claim 1, wherein after the N acquisition steps, a repeat interval with a duration $\Delta t_w$ is waited for and wherein the duration $\Delta t_w$ is at least as long as a largest span between two successive starting points in time $t_{s,n}$ and $t_{s,n+1}$ or at least as long as the span from the first starting point in time $t_{s,1}$ in respect to an end of the inversion pulse.

6. Method according to claim 1, wherein at least two nuclear-magnetic measuring processes are carried out such that, in each case, two chronologically successive echo signals $s_{e,n}$ and $s_{e,n+1}$ in the echo intervals are measured in different nuclear-magnetic measuring processes.

7. Method according to claim 1, wherein a +180°$_x$-pulse is used as the inversion pulse, a +90°$_x$-pulse is used as the activating pulse, a −90°$_x$-pulse is used as the deactivating pulse and a +180°$_y$-pulse is used for both the first refocusing pulse the second refocusing pulse.

8. Method according to claim 1, wherein phase differences between the inversion pulse, the activating pulse, the first refocusing pulse, the second refocusing pulse, the deactivating pulse and the echo signal $s_{e,n}$ are cycled.

9. Method according to claim 8, further comprising:

carrying out a first nuclear-magnetic measuring process and a second nuclear-magnetic measuring process in respect to a phase of the inversion pulse and of the activating pulse in the first nuclear-magnetic measuring process such that, in the first nuclear-magnetic measuring process, a phase difference of each of the first refocusing pulse and of the second refocusing pulse is 90°, a phase difference of the deactivating pulse is 180° and a phase difference of the echo signal $s_{e,1}$ is 0° and in the second nuclear-magnetic measuring step, a phase difference of each of the inversion pulse and of the activating pulse is 180°, a phase difference of each of the first refocusing pulse and of the second refocusing pulse is 90°, and a phase difference of the deactivating pulse is 0° and a phase difference of the echo signal $s_{e,2}$ is 180°.

10. Method according to claim 8, further comprising:
carrying a first nuclear-magnetic measuring process, a second nuclear-magnetic measuring process, a third nuclear-magnetic measuring process and a fourth nuclear-magnetic measuring process in respect to a phase of the inversion pulse and of the activating pulse in the first nuclear-magnetic measuring process, such that, in the first nuclear-magnetic measuring process, a phase difference of each of the first refocusing pulse and of the second refocusing pulse is 90° and
measuring a phase difference of the deactivating pulse is 180° and a positive real part of the echo signal $s_{e,1}$ with a first channel and a positive imaginary part of the echo signal $s_{e,1}$ with a second channel,
in the second nuclear-magnetic measuring process, a phase difference of each of the inversion pulse and of the activating pulse is 180°, a phase difference each of the first refocusing pulse and of the second refocusing pulse is 90° and a phase difference of the deactivating pulse is 0° and that a negative real part of the echo signal $s_{e,2}$ is measured with the first channel and a negative imaginary part of the echo signal $s_{e,2}$ is measured with the second channel,
in the third nuclear-magnetic measuring process, a phase difference of each of the inversion pulse and of the activating pulse is 90°, a phase difference of each of the first refocusing pulse and of the second refocusing pulse is 180° and a phase difference of the deactivating pulse is 270° and a negative real part of the echo signal $s_{e,3}$ is measured with the second channel and a positive imaginary part of the echo signal $s_{e,3}$ is measured with the first channel, and
in the fourth nuclear-magnetic measuring process, a phase difference of each of the inversion pulse and of the activating pulse is 270°, a phase difference of each of the first refocusing pulse and of the second refocusing pulse is 180° and a phase difference of the deactivating pulse is 90° and a positive real part of the echo signal $s_{e,4}$ is measured with the second channel and a negative imaginary part of the echo signal $s_{e,4}$ is measured with the first channel.

11. Nuclear-magnetic flowmeter, comprising:
a measuring tube,
a magnetization means,
a measuring unit, and
a magnetized medium in the measuring tube during operation,
wherein the measuring unit has means for:
carrying out at least one nuclear-magnetic measuring process on the magnetized medium in the measuring tube that includes an inversion pulse and N={2, 3, 4, ... } acquisition sequences, each of the N acquisition sequences beginning at a starting point in time $t_{s,n}$ with n={1, ... , N} in respect to the at least one nuclear-magnetic measuring process and having an activating pulse, a first waiting interval with a duration $\Delta t_d$, a first refocusing pulse, an echo interval with a duration $\Delta t_e$, a second refocusing pulse, a second waiting interval with the duration $\Delta t_d$ and a deactivating pulse,
measuring an echo signal $s_{e,n}$ in each echo interval, and
determining a longitudinal relaxation time constant $T_1$ of the medium using the echo signal $s_{e,1}, \ldots, s_{e,N}$.

* * * * *